United States Patent [19]

Karg

[11] Patent Number: 5,282,993
[45] Date of Patent: Feb. 1, 1994

[54] LIGHT-STABLE SEMICONDUCTOR MATERIAL BASED ON AMORPHOUS GERMANIUM AND A METHOD FOR ITS PRODUCTION

[75] Inventor: Franz Karg, Munich, Fed. Rep. of Germany

[73] Assignee: Siemens Aktiengesellschaft, Munich, Fed. Rep. of Germany

[21] Appl. No.: 861,964

[22] PCT Filed: Jan. 29, 1991

[86] PCT No.: PCT/EP91/00165
§ 371 Date: Jun. 17, 1992
§ 102(e) Date: Jun. 17, 1992

[87] PCT Pub. No.: WO91/12632
PCT Pub. Date: Aug. 22, 1991

[30] Foreign Application Priority Data
Feb. 7, 1990 [EP] European Pat. Off. ........ 90102434.9

[51] Int. Cl.$^5$ ................... H01L 29/14; H01L 31/028
[52] U.S. Cl. .................... 252/63.2 BT; 136/249; 136/258; 257/55; 257/56; 257/63; 257/65; 427/533; 427/535; 427/569; 427/578; 437/4; 437/101; 252/501.1
[58] Field of Search .............. 437/4, 101; 427/578, 427/569, 573, 533, 535; 252/62.3 V, 62.3 BT, 501.1; 136/258 AM, 249 TJ; 257/55, 56, 63, 65

[56] References Cited
FOREIGN PATENT DOCUMENTS
A3212184 11/1982 Fed. Rep. of Germany .
56-122123 9/1981 Japan .................. 136/258 AM

OTHER PUBLICATIONS

V. Premachandran et al., *Thin Solid Films*, vol. 88, Feb. 1982, pp. 335–338.
"Chemical Bonding of Hydrogen & Oxygen in Glow–Discharge Deposited Thin Films of a-Ge: H and a-Ge:h,O", by G. Lucovsky et al, *Physical Review B*, Condensed Matter, vol. 31, No. 4, Feb. 15, 1985, New York pp. 2190–2197.
"Influence of Plasma Deposition on Structural & Electronic Properties Ofa-Ge:H", by F. H. Karg et al, *Journal of Non-Crystalline Solids*, vol. 114, (1989), Amsterdam, North-Holland, pp. 477–479.
"Electrical Optical and Structural Properties of Reactive Ion Beam Sputtered Hydrogenated Amorphous Germanium (a-Ge:H) Films", by M. K. Bhan et al, *Journal of Applied Physics*, vol. 65, No. 1, Jan. 1, 1989, New York, pp. 241–247.

*Primary Examiner*—Aaron Weisstuch
*Attorney, Agent, or Firm*—Hill, Steadman & Simpson

[57] ABSTRACT

An amorphous semiconductor material which does not age under the action of light is particularly suitable for red-sensitive photovoltaic components and is highly photosensitive. The amorphous semiconductor material is germanium based, particularly a silicon-germanium alloy. To this end, the semiconductor material has a compact, void-free structure, is manufactured in a glow discharge reactor by appropriate variation of the precipitation parameters, and contains one element from Group VI A of the periodic system.

7 Claims, 1 Drawing Sheet

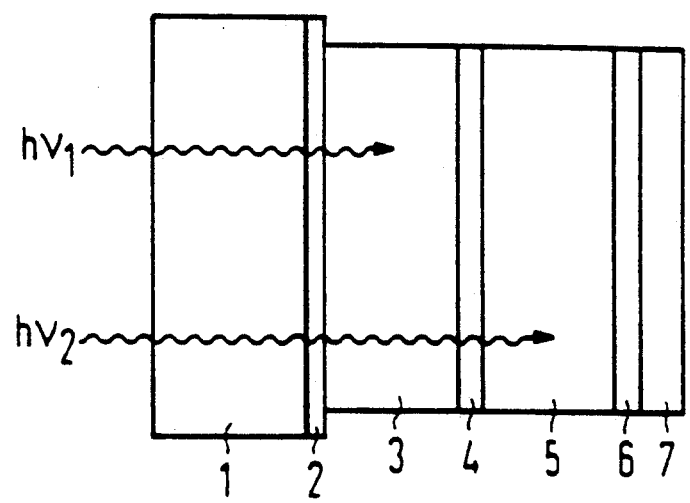

LIGHT-STABLE SEMICONDUCTOR MATERIAL BASED ON AMORPHOUS GERMANIUM AND A METHOD FOR ITS PRODUCTION

BACKGROUND OF THE INVENTION

The invention relates to a new semiconductor material based on amorphous germanium, preferably for red-sensitive photovoltaic components, and a method for its production.

In order to reduce the production costs for solar cells, and hence the costs of providing photovoltaically generated energy, suitable materials are being sought for thin-film solar cells based on amorphous semiconductors. These materials are intended to replace solar cells consisting of crystalline semiconductor material which, although powerful, are also expensive and are not competitive in comparison with other energy sources. They have numerous advantages in production and are distinguished, for example, by low process temperatures of less than 250° C. and low material consumption. Layer thicknesses of less than 1 μm are sufficient for complete absorption of light. In addition, it is possible to produce large-area semiconductor films on cheap substrates, for example window glass, by suitable deposition methods.

A disadvantage of amorphous solar cells is their relatively low efficiency compared with crystalline solar cells. With small areas, the efficiency can reach 12 percent, but the efficiency is only 9 percent in the case of a 1000 cm² module. A further disadvantage is the lack of light stability of the cells. Even the best of the known solar cells of amorphous semiconductor material exhibit 15 to 20 percent ageing within the first few months when used in the field, which becomes noticeable by a reduced efficiency.

A possible cell structure which avoids these disadvantages is the tandem cell. In this case, a plurality of solar cells each with a different energy gap, and hence different spectral sensitivity, are connected one behind the other. A combination of amorphous silicon with an energy gap of approximately 1.75 eV and a cell of an amorphous silicon-germanium alloy or of amorphous germanium itself with an energy gap of between 1.0 and 1.2 eV, connected downstream from it, would, for example, be suitable. Using this tandem cell structure, theoretical efficiencies of over 20 percent are possible.

An amorphous semiconductor material which has a low energy gap of 0.9 to 1.2 eV with a simultaneously low density of states at a maximum of $5 \times 10^{15}$ defects/cm³ eV within the energy gap is, however, unknown. The amorphous semiconductor material, which is suitable for solar cells, with the lowest energy gap to date of 1.4 to 1.5 eV is an amorphous silicon-germanium alloy with a germanium content of up to 30 percent. However, a material with a higher germanium content, and hence a lower energy gap, is necessary for optimum matching to the blue-sensitive amorphous silicon cell. However, such semiconductors, produced using the glow-discharge method, have until now exhibited major material inhomogeneities, a high density of states, and considerable instability with respect to air humidity. The attempt to deposit amorphous germanium layers by reactive sputtering of a germanium target admittedly also produces a material with an improved photo-conductivity, but which has been found to be unstable with respect to relatively lengthy periods of strong illumination (light-ageing).

U.S. Pat. No. 4,471,042 discloses an amorphous semiconductor material for electro-photography, which consists of pure germanium or germanium/silicon alloys.

An article by Lucowski et al. in *Physical Review* B, Volume 31, No. 4, 1985, pages 2190–2197 discloses thin layers of amorphous germanium and amorphous germanium alloys which are produced in a glow-discharge method in a pure germanium-hydride atmosphere.

SUMMARY OF THE INVENTION

The object of the present invention is thus to specify an amorphous semiconductor material which has a low energy gap required for tandem cells of less than 1.4 eV, and preferably an energy gap of 0.9 to 1.2 eV, with a simultaneously high photo-conductivity.

This object is achieved according to the invention by means of an amorphous semiconductor based on germanium.

The light-stable amorphous semiconductor material, preferably for red-sensitive cells in photovoltaic components, consists of 80 to 90 percent by atomic weight of $Ge_{1-x}Si_x$, where $0 \leq x \leq 0.7$, 5 to 20 percent by atomic weight of hydrogen, and oxygen in a concentration of $5 \times 10^{19}$ cm⁻³ to $2 \times 10^{21}$ cm⁻³. The semiconductor material has a compact structure without demonstrable cavities and has a standardized photo-conductivity ($\mu\eta\tau$) of more than $10^{-7}$ cm²/Vs.

Further configurations of the invention and a method for producing the semiconductor material are as follows:

The semiconductor material can have an energy gap of 0.9 to 1.4 eV. Also, the semiconductor material can contain no silicon (X=0).

The method of the present invention produces a light-stable semiconductor material based on amorphous germanium on a substrate, preferably as a red-sensitive material for photovoltaic components in which, in an atmosphere of at least 80 to 97.5 percent by atomic weight of hydrogen and 2.5 to 20 percent by atomic weight of germanium hydride at a pressure of 0.2 to 2 mbar and a substrate temperature of 100° to 300° C., a glow-discharge is carried out in such a manner that the ion energy of the ions impinging on the substrate is at least 100 eV. The semiconductor material produced on the substrate is subjected to treatment with a gas containing at least oxygen.

The glow-discharge can be carried out in an atmosphere which contains oxygen or a compound of oxygen. The treatment can be carried out after deposition of the semiconductor material, and at a temperature in the region of the deposition temperature, for at least 10 minutes. The treatment can be carried out after deposition, with a hydrogen plasma containing oxygen.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawing, and in which:

The single FIGURE depicts a tandem solar cell constructed according to the present invention.

DESCRIPTION OF THE PREFERRED EMBODIMENT

The semiconductor material according to the invention has an energy gap of between 1.4 eV for a material with a silicon-germanium ratio of 30:70, and 0.9 eV for a silicon-free semiconductor material. As a result of the deliberate incorporation of a Group VI A element, such as oxygen, the defect density within the energy gap of the semiconductor material is considerably reduced, which leads to an improved photo-conductivity. At the same time, a relatively low dark conductivity is observed so that the overall photo-sensitivity is still further improved. A precondition for these good characteristics is the already mentioned low density of states of the material according to the invention, which in turn is a result of the incorporation of a Group VI A element.

This is surprising to the extent that, until now, efforts have always been directed, in known methods, at preventing the incorporation of a Group VI A element, particularly oxygen. In the case of the invention, this component is now deliberately raised above that known until now, which was caused by impurities. The material accordingly contains such an element in a component of more than $5 \times 10^{19}$ cm$^{-3}$, which corresponds to the limiting value of an impurity, for example oxygen, which until now has been normal and obtained in normal deposition systems.

A further increase in this component results in a further reduction in the defect density until an optimum is reached in terms of material characteristics. Thereafter, the characteristics deteriorate again so that an upper limit of approximately 5 percent by atomic weight or $2 \times 10^{21}$ cm$^{-3}$ is determined for the components of the Group VI A element. Since the optimum value is also dependent on the composition of the semiconductor material according to the invention, it is also influenced by the deposition method, likewise according to the invention, and by the parameters set in this case.

A possible explanation for the observed advantageous effects of using, for example, oxygen can be found in the structurally-dependent electronic states of the germanium. In addition to the "normal" germanium-germanium bonds with a gap corresponding to exact and crystalline material, amorphous germanium also has expanded, and thus weaker, germanium-germanium bonds. The resulting electronic states, which differ from normal germanium bonds, lie within the energy gap and have a relatively low energy difference with respect to normal germanium bonds. As a result, they can particularly greatly reduce the photo-conductivity by trapping the charge-carrier pairs produced.

A bivalent Group VI A element can now insert itself between the two germanium atoms of such an extended bond and enter into a firm bond therewith because of the chemical affinity. The electronic states which lie within the energy gap and are thus disturbing are in this way eliminated. As a result of this plausible explanation, it also becomes clear that the size of the Group VI A element cannot be increased indefinitely and must be matched to the structure of the amorphous germanium.

A further characteristic of the semiconductor material according to the invention is its compact structure, which has no detectable cavities whatsoever. Conventional amorphous germanium or an amorphous material with a high germanium content and a hydrogen content of over 5 percent by atomic weight has a feature in the IR spectrum which is caused by material cavities. As well as a normal absorption band of approximately 1880 cm$^{-1}$, which is caused by permanently incorporated hydrogen, a known non-compact material having a further band at approximately 1980 cm$^{-1}$. The latter band is typical for hydrogen bonded into material cavities and is thus a measure for low compactness. In the material according to the invention, this band has disappeared, thus no cavities can be detected in the semiconductor material.

Furthermore, the IR spectrum is also suitable for detecting the atom of the Group VI A elements. Oxygen is detected, for example by an absorption band between 700 and 800 cm$^{-1}$, which results from germanium-oxygen bonds.

The most important characteristic, and that which is most advantageous for use of the semiconductor material according to the invention in photovoltaic components, is, however, its stability with respect to light-ageing. Under AM 1 illumination, the photo-conductivity and dark conductivity are observed separately from one another for more than 1000 hours. Constant conductivity values were measured during the observation period for a plurality of different samples in each case, within the framework of the measurement accuracy. From this, a high light-stability, which is virtually unlimited in time, can also be concluded since known amorphous semiconductors have already exhibited the majority of their ageing-dependent power loss in this period. The virtually invariably good photo-sensitivity of the new material indicates the superiority of the amorphous germanium, or its alloy, according to the invention, as compared with known materials. This becomes particularly evident for pure germanium, or germanium without a silicon component, which in the prior art has not been suitable for solar cells.

In the method according to the invention for producing light-stable amorphous germanium material, the parameters are set such that, on the one hand, a compact material is achieved and, on the other hand, an increased foreign atom content of a Group VI A element is achieved. The deposition principle is in this case glow discharge, known per se, and its variations. The decisive factor for the compactness of the semiconductor material according to the invention is the level of the ion energy with which germanium and germanium-hydrogen fragment ions impinge on the substrate. In total contrast to the production of amorphous silicon with a high electronic quality, in which the ion energy may not exceed 100 electron volts, an ion bombardment energy of a minimum of 100 electron volts is now set according to the invention. Suitable deposition energies lie between 100 and 300 electron volts, deteriorations in the quality of the semiconductor material produced being observed, once again, at the upper end of the range.

The normal deposition conditions are typical for glow discharges and can be set in accordance with already known methods. The deposition thus takes place, for example, at a pressure of 0.2 to 2 mbar, a substrate temperature of 100° to 300° C. in an atmosphere which contains 80 to 97.5 percent by atomic weight of hydrogen. Selected as the germanium source is a gaseous germanium hydride in a concentration of 2.5 to 20 percent by atomic weight in the reaction atmosphere. For specific applications, or to influence the energy gap, the germanium component can be partially replaced by silicon, or the germanium hydride can be enriched with silane. Silicon-germanium alloys produced in this way likewise exhibit the advantageous characteristics of high photo-sensitivity with excellent long-term stability under illumination.

An increase in the ion energy is possible by means of various measures. For example, the area of the electrode supporting the substrate in a capacitively coupled glow-discharge reactor can be reduced. If the plasma is generated using a varying DC voltage, the ion energy can be increased by the application of an additional external, accelerating electrical field. A further possibility for increasing the ion energy is by means of an increase in the deposition power with the other conditions remaining constant. Since each of the embodiments has its own intrinsic advantages and disadvantages, the method can be selected depending on the particular requirement.

The incorporation of a Group VI A element into the amorphous semiconductor takes place according to the invention by treating the semiconductor material produced on the substrate with a gas which contains an element or a compound of an element of the Group VI A elements. One possibility for this consists of mixing a suitable gas into the glow-discharge atmosphere during the deposition process and of thus incorporating the foreign element during production of the semiconductor layer. A further possibility consists of depositing the amorphous semiconductor layer without a foreign element and of not introducing the latter into the layer until later, by means of a suitable treatment. In order to incorporate oxygen it is adequate, for example, to enrich a layer, which has been deposited in a suitably oxygen-free manner, therewith by means of a temperature treatment in an oxygen atmosphere. Such a treatment with hydrogen sulfide or hydrogen selenide leads to the subsequent incorporation of sulfur or selenium. If this treatment is carried out at a temperature in the region of the deposition temperature of approximately 100° to 300° C., a treatment duration of approximately 10 minutes to 2 hours is adequate to achieve an optimum form of the element. In order to accelerate the incorporation of the foreign element, the semiconductor layer produced can be treated with a plasma containing the suitable foreign element of the Group VI A elements. The gas used for this purpose, which contains the foreign element, is in this case mixed with hydrogen. Oxygen is incorporated, for example, by treating the semiconductor layer with a hydrogen-oxygen plasma.

An advantageous use of the semiconductor material according to the invention for the red-sensitive subcells of a tandem solar cell is described in more detail in the following text. FIG. 1 shows a possible construction for a tandem solar cell.

For optimum matching of a solar cell to the spectrum of the natural sunlight, two individual cells with a different sensitivity range are advantageously connected optically one behind the other. For example, a tandem cell structure whose first blue-sensitive subcell consists of a conventional pin-diode of amorphous silicon (a-Si:H) with an energy gap of 1.75 eV, while the second red-sensitive subcell, connected optically thereto, has an energy gap of 1.0 to 1.2 eV and advantageously consists of amorphous germanium according to the invention or of an amorphous germanium-silicon alloy, likewise according to the invention, represents a good combination. Optically connected in this case thereby designates an arrangement such that long-wave light (h·$v_2$) which is not absorbed by the first subcell can penetrate into the second subcell arranged behind it where the light is absorbed, generating pairs of charge-carriers. In this case, the two subcells can be separated from one another by an electrically insulating but transparent layer, independent connections then being provided for each subcell. However, it is technically simpler from the method point of view to produce a tandem cell in which the two subcells are deposited and produced directly superimposed.

FIG. 1 shows the construction of such a tandem solar cell which consists of two subcells and is constructed like a stack, one above the other. A transparent electrode 2, for example a fluorine-doped indium-tin-oxide (TCO), is deposited onto a transparent substrate 1, consisting for example of glass. A known thin-film solar cell, for example a pin-structure 3 of amorphous silicon, is now deposited thereon in a glow-discharge reactor. The short-wave component h·$v_1$ of the incident light h·$v$ is absorbed in this solar cell. A diode of amorphous germanium is now deposited thereon, subject to changing the deposition conditions, without further wiring or the fitment of electrodes. This diode consists essentially of an absorber layer, approximately 0.1 to 0.5 μm thick, of undoped or weakly doped amorphous germanium containing, for example, oxygen (a:Ge:H:O). As in the case of conventional amorphous solar cells, this absorber layer 5 is arranged between two p-doped and n-doped layers 4 and 6, each of which is approximately 5 to 20 nm thick. The latter layers consist of amorphous germanium, or the compact material according to the invention containing a Group VI A element. In a minor variation, a modified absorber material can be used for the doped layers 4 and 6, which absorber material has an optical absorption which is reduced in comparison with the material of the absorber layer 5. This absorber material may be, for example, a microcrystalline germanium whose lower optical absorption ensures a greater absorption in the actual absorber layer 5. Alternatively, the layer 4 may consist of an amorphous silicon-germanium alloy $Ge_{1-x}Si_x$ ($0 \leq X \leq 3$), whose absorption coefficient is likewise low for red-wavelength light. Alternatively, the layer 5 can also have a small silicon component in order to raise the energy gap to the desired value.

Finally, the tandem structure is provided with a highly reflective rear contact 7, for example by sputtering or vapor deposition of a metal. Contact with the tandem cell is made on the layers 2 and 7.

Using such a cell, theoretical efficiencies up to 20 percent are possible, which correspond approximately to that of crystalline individual solar cells. In addition, using the material according to the invention, it is for the first time possible to construct a light-stable thin-film tandem solar cell which is exactly matched to the spectrum of natural sunlight.

However, other possibilities for the application of the material according to the invention are conceivable, for example for red-sensitive photodiodes. With a dark conductivity of the amorphous germanium containing oxygen (a-Ge:H:O) of $10^{-5}$ (Ohm cm)$^{-1}$, the electrical conductivity under white AM 1 illumination of 100 mW/cm$^2$ increases by the factor 5 to 10. This corresponds to a standardized photo-conductivity ($\eta v \tau$ product) of approximately $5 \times 10^{-7}$ cm$^{-2}$/Vs. On the basis of these characteristics, further applications are also possible, for example in integrated optoelectronic components.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A light-stable amorphous semiconductor material based on amorphous germanium, preferably for red-sensitive cells in photovoltaic components, consisting of 80 to 90 percent by atomic weight of $Ge_{1-x}Si_x$, where $0 \leq x \leq 0.7$, 5 to 20 percent by atomic weight of hydrogen, and oxygen in a concentration of $5 \times 10^{19}$ cm$^{-3}$ to $2 \times 10^{21}$ cm$^{-3}$, the semiconductor material having a compact structure without demonstrable cavities and having a standardized photo-conductivity of more than $10^{-7}$ cm$^2$/Vs.

2. The semiconductor material as claimed in claim 1, wherein the semiconductor material has an energy gap of 0.9 to 1.4 eV.

3. The semiconductor material as claimed in claim 1, wherein the semiconductor material contains no silicon, x being equal to zero [(X=0)].

4. A method for producing a light-stable semiconductor material based on amorphous germanium on a substrate, preferably as a red-sensitive material for photovoltaic components, comprising the steps of: providing an atmosphere of at least 80 to 97.5 percent by atomic weight of hydrogen and 2.5 to 20 percent by atomic weight of germanium hydride at a pressure of 0.2 to 2 mbar and a substrate temperature of 100° to 300° C., carrying out a glow-discharge in such a manner that ion energy of ions impinging on the substrate is at least 100 eV, and subjecting the semiconductor material produced on the substrate to treatment with a gas containing at least oxygen.

5. The method as claimed in claim 4, wherein the glow-discharge is carried out in a glow discharge atmosphere which contains oxygen or a compound of oxygen.

6. The method as claimed in claim 4, wherein said treatment is carried out after deposition of the semiconductor material, and at a temperature in the region of the deposition temperature, for at least 10 minutes.

7. The method as claimed in claim 4, wherein said treatment is carried out after deposition of the semiconductor material, with a hydrogen plasma containing oxygen.

* * * * *